United States Patent
Gallo et al.

(10) Patent No.: US 6,917,545 B2
(45) Date of Patent: Jul. 12, 2005

(54) DUAL BUS MEMORY BURST ARCHITECTURE

(75) Inventors: Girolamo Gallo, Avezzano (IT);
Giuliano Gennaro Imondi, Rieti (IT);
Giovanni Naso, Frosinone (IT);
Tommaso Vali, Sezze (IT)

(73) Assignee: Micron Technology, Inc., Boise, ID (US)

( * ) Notice: Subject to any disclaimer, the term of this patent is extended or adjusted under 35 U.S.C. 154(b) by 130 days.

(21) Appl. No.: 10/367,587

(22) Filed: Feb. 14, 2003

(65) Prior Publication Data

US 2004/0071037 A1 Apr. 15, 2004

(30) Foreign Application Priority Data

Jul. 9, 2002 (IT) .................................. RM2002A0369

(51) Int. Cl.[7] .............................................. G11C 16/04
(52) U.S. Cl. ............................. 365/189.01; 365/189.02; 365/189.05; 365/189.12; 365/230.03; 365/230.04
(58) Field of Search ....................... 365/189.01, 189.02, 365/189.05, 230.03, 230.04

(56) References Cited

U.S. PATENT DOCUMENTS

| | | |
|---|---|---|
| 5,732,406 A | 3/1998 | Bassett |
| 6,202,120 B1 | 3/2001 | Lang |
| 6,243,309 B1 * | 6/2001 | Shin ........................... 365/201 |
| 6,580,637 B2 * | 6/2003 | Pascucci ................. 365/185.11 |

* cited by examiner

*Primary Examiner*—Van Thu Nguyen
*Assistant Examiner*—Pho M. Luu
(74) *Attorney, Agent, or Firm*—Leffert Jay & Polglaze, P.A.

(57) ABSTRACT

A method and apparatus for a memory device including a burst architecture employs a double bus architecture that is multiplexed onto an output bus at clock rate that is doubled. The resulting architecture effectively doubles throughput without increasing memory device latency.

13 Claims, 7 Drawing Sheets

US 6,917,545 B2

DUAL BUS MEMORY BURST ARCHITECTURE

RELATED APPLICATION

This application claims priority to Italian Patent Application Serial No. RM2002A000369, filed Jul. 9, 2002, entitled "Dual Bus Memory Burst Architecture," which is commonly assigned.

TECHNICAL FIELD

The present invention is related to a method and apparatus for increasing the throughput for a memory device, in particular, a method and apparatus for a burst architecture with a double clock rate in a memory device.

BACKGROUND INFORMATION

Memory designers strive to increase the throughput of memories, i.e., the speed of the data read from or written to the memory, expressed generally in megabytes per second (Mbytes/second), to match the increasing speed of microprocessors associated with the memory in a system. One way to increase throughput is to use a burst architecture in which the data flows out of the memory in bursts of data. The data is first fetched from the memory and stored in registers, then it is clocked out in bursts by a fast clock from the registers to the output (I/Os). One limitation of the burst method is that data in the bursts comes from memory locations nearby. This limitation, however, is generally accepted because it is very likely that the next data needed will be very close in the memory space to the previously fetched data. For this reason burst architectures are very common in memories, particularly in DRAM and flash memories.

SUMMARY OF THE INVENTION

Accordingly, the embodiments of the present invention include a burst memory architecture comprising a memory array, a plurality of sense amplifiers to read data from the memory array, a plurality of first and second storage circuits to receive the data from the plurality of sense amplifiers, a first plurality of drivers to receive the data from the plurality of first and second storage circuits and a second plurality of drivers to receive the data from the plurality of first and second storage circuits, a first bus to receive the data from the first plurality of drivers, a second bus to receive the data from the second plurality of drivers, a switch to multiplex the data from the first and second busses onto an output bus; and a controller to provide control signals to the memory wherein the data is loaded alternately on the first and second busses. Other embodiments of the present invention include a method of burst access to a memory including fetching a first set of data from the memory in a first time period, loading the first set of data on to a first memory bus, fetching a second set of data from the memory in a second time period, loading the second set of data on to a second memory bus, and sequentially switching the data from the first and second memory busses on to an output bus.

BRIEF DESCRIPTION OF THE DRAWINGS

Features and advantages of the present invention will become more apparent from the following description of the preferred embodiments described below in detail with reference to the accompanying drawings where.

DETAILED DESCRIPTION

In the following detailed description, reference is made to the accompanying drawings that form a part hereof, and in which is shown by way of illustration specific embodiments in which the invention may be practiced. It is to be understood that other embodiments may be utilized and structural changes may be made without departing from the scope of the present invention.

Figure 1:
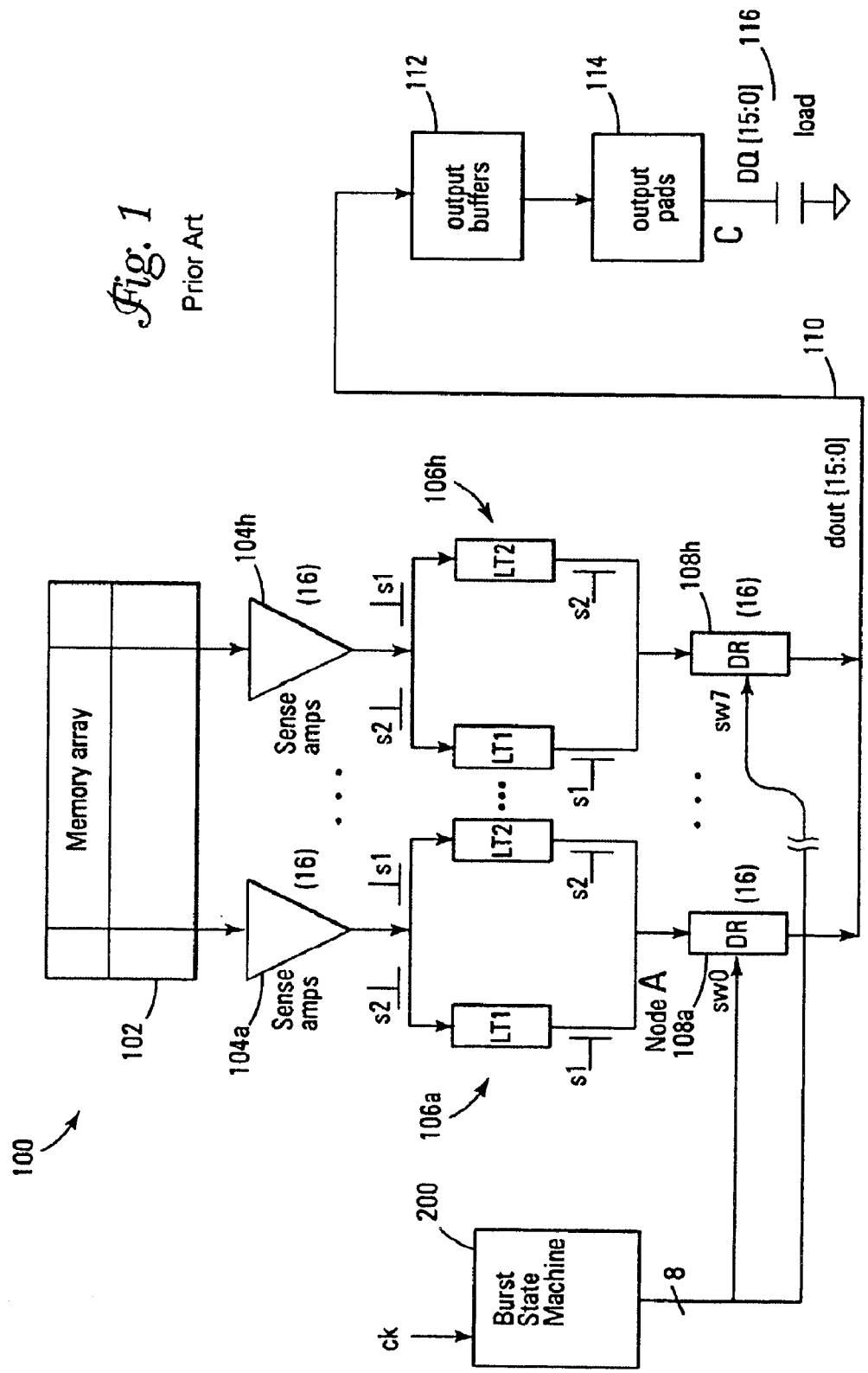
FIG. 1 is an illustration of one example of a conventional burst architecture for a memory.

One example of a burst memory scheme is shown in FIG. 1. In this example, data is fetched from the memory 100 in blocks of n words of m bits each (e.g., 8 words of 16 bits each). Data coming out from the memory cells of memory array 102 is read by n×m (e.g., 8×16) sense amp banks 104a to 104h. In FIG. 1, for simplicity, only two sense amp banks 104a and 104h are shown. The data is then loaded into 8 blocks of latches 106a to 106h. Other types of storage circuits or registers to maintain the data may of course be used. Each block 106a to 106h includes two latches each, LT1 and LT2, respectively.

Periodic signals s1 and s2 are provided by a controller such as burst state machine 200 to latch blocks 106a to 106h. s1 and s2 are periodic and clocked by the same external clock signal ck but are out of phase. Each s1, s2 signal lasts for n (e.g., n=8) clock cycles to allow the transfer of the n words to the output buffers through the drivers DR. In this example s1 and s2 are opposite in phase. During phase s1 data is transferred from sense amps 104a to 104h, to latches LT2 of latch blocks 106a to 106h and data previously stored in latches LT1 of latch blocks 106a to 106h is released to node A. During phase s2, data is stored in LT1 while data previously stored in latches LT2 is released to node A. This sequence continues for the duration of the burst operation and allows pipeline operation i.e., data is sent out of the chip at the same time as new data is retrieved from the memory.

In general, the speed of a data transfer is limited by the propagation delay of the device. In the example of FIG. 1, data is sent out of memory 100 at a speed that is a function of the propagation delay from the output of latches 106a to 106h at node A through the output pads 114 of memory 100 at node C. The path includes drivers (DR) 108a to 108h feeding the m bit (e.g., 16 bit) bus 110 (dout[15:0]), and output buffers 112 driving load 116 on output pads 114. The period of the signal for clocking the data through the device cannot be less than the propagation delay of the device. Thus, in FIG. 1 the period of the clock cannot be less than the time it takes data to propagate from node A to node C. For example, if the propagation delay is less than or equal to 24 ns and the clock is set at 24 ns, then every 24 ns a new word can be present on the output pads 114 (DQ[15:0]) at node C.

In the example of FIG. 1 where there are n words per burst (e.g., 8), the particular word coming out (w0 . . . w7) is selected by n signals (sw0 . . . sw7) generated by burst state machine 200, which is clocked by a clock ck. Each n signal (sw0 . . . sw7) lasts for one clock cycle.

Figure 2:
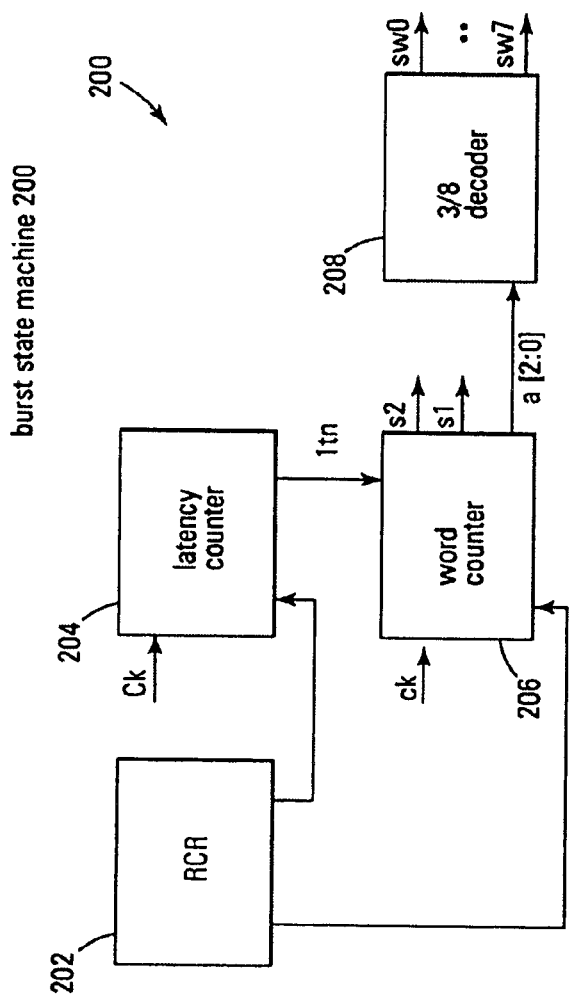
FIG. 2 is a block diagram of one example of a conventional burst state machine for a burst memory architecture.
Figure 2A:
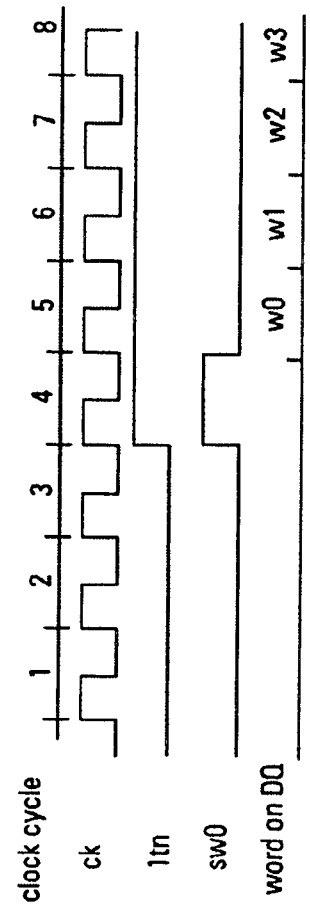
FIG. 2a is a simplified timing diagram of the operation of the burst state machine shown in FIG. 2.
Figure 2B:
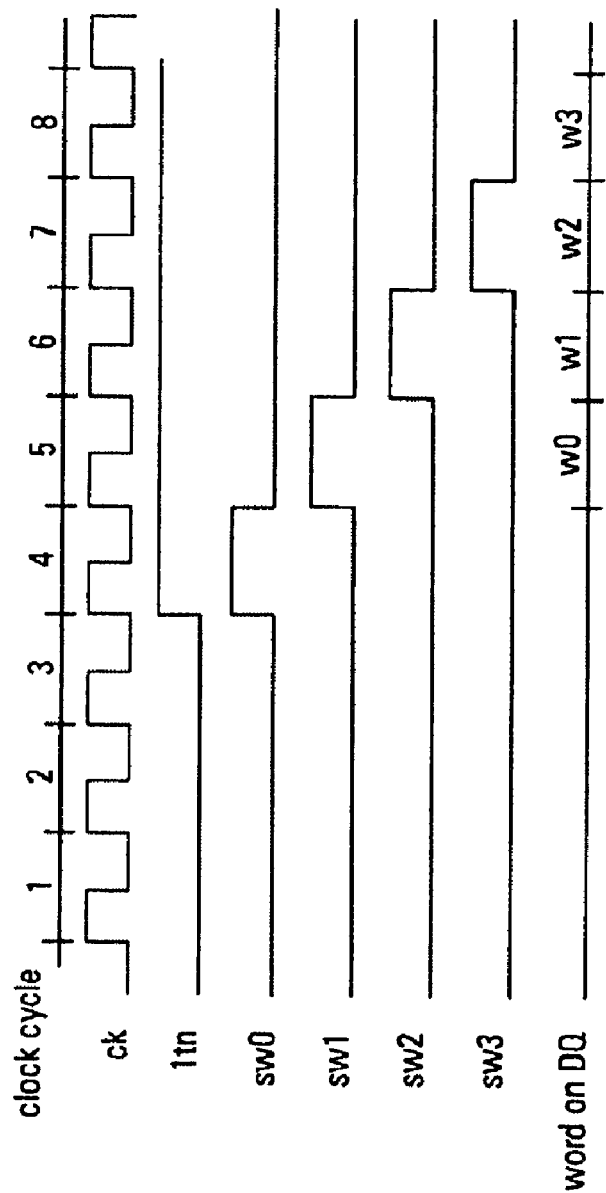
FIG. 2b shows a more detailed timing diagram of the operation of the burst state machine shown in FIG. 2.

An example of a simplified block diagram of controller or burst state machine 200 is shown in FIG. 2. FIG. 2a is a timing diagram of the first data after the latency. A more complete timing diagram including n signals (sw0 through sw7) is shown diagram in FIG. 2B, in the case of a burst if 4 data words are present. Burst state machine 200 includes a Read Configuration Register block (RCR) 202, which is used to set the count mode of word counter 206. RCR 202 is a set of latches that can be written by the user to set various count modes, such as: latency, burst length, active clock edge, count forward—backward, hold data for one clock or two clocks. Word counter 206 provides signals s1 and s2 and counter output (a[2:0]) which is supplied to a ⅜ decoder 208. For example, if word counter 206 is set to count up, the output of decoder 208 will be signal sw0 followed by sw1, then by sw2, and so on. One signal (sw0 . . . sw7) at a time is held in the active state by decoder 208 and is provided to drivers 306a to 306h thus enabling the selection of one word a time (w0 . . . w7) on the m bit bus 100 (dout[15:0]). RCR block 202 also sets the latency in latency counter 204. In the example of the FIG. 2, the latency is set to 4 cycles. After 3 clock cycles, the carry signal ltn is provided by latency counter 204 to word counter 206 to increment word counter 206 by one. After the $4^{th}$ clock cycle, which is needed to get the signals from A to C, w0 is present on the output pads 114 (DQ [15:0]). In this example, a latency of 4 clock cycles means that it takes 96 ns (i.e. 4×24 ns) from the rising edge of clock cycle 1 to the rising edge of clock cycle 4 for a data word to propagate to the output pads 114. It should be noted for the sake of clarity, that, in practice, a true 4 clock cycle latency requires that sw0 must be present 1–2 ns (the so-called "set-up time") before the rising edge of the $5^{th}$ clock. In fact, the external circuit (not shown in FIG. 2) that reads sw0 requires that the data be stable for a given a set-up time before the useful clock edge for strobing the data. The same applies for the n signals (sw1 . . . sw7). The set-up time, however, is not relevant to discussion of the present invention.

Figure 3:
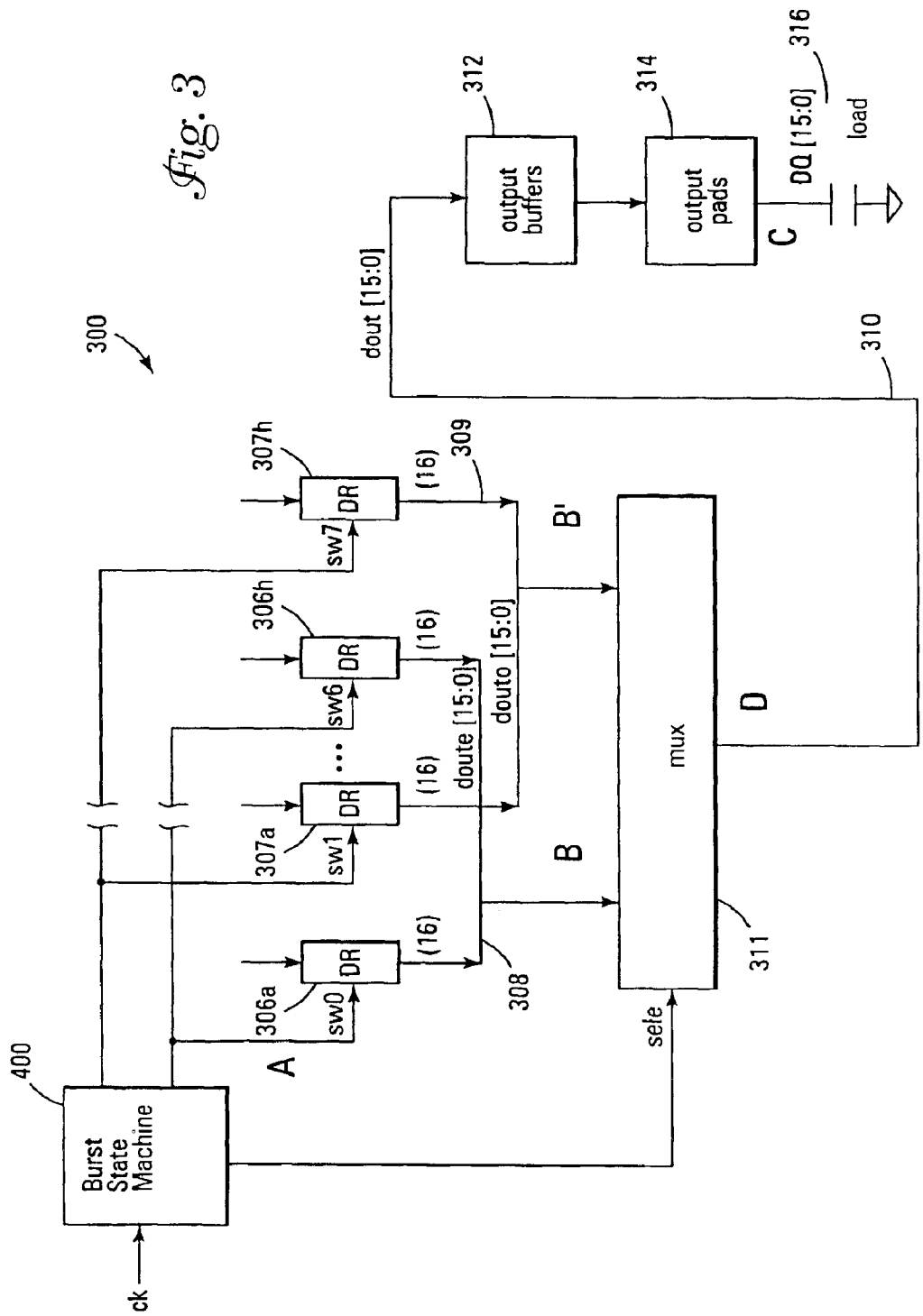
FIG. 3 shows one example of a double bus burst architecture for a memory according to the present invention.

An example of an architecture according to the present invention regarding the data path from A to B is shown in FIG. 3. In the example of FIG. 3, there are two data busses instead of one: an even data bus 308 (doute [15:0]), and an odd data bus 309 (douto [15:0]). Even data bus 308 collects only the even words, while odd data bus 309 collects the odd words. The even and the odd words are selected by signal sele applied to selection circuit 311, which may be a multiplexer. Sele can be provided by the burst state machine 400 or otherwise derived from ck. When sele is high, for example, even words are routed to bus 310 (dout[15:0]). When sele is low, the odd words are routed to bus 310 (dout[15:0]). The data path is actually split in two trunks: from A to B (or from A to B') and from D to C. Assuming, for the sake of simplicity, that there is negligible propagation delay in selection circuit 311, particular care should be taken in the layout, in order to equalize as much as possible the propagation delay from A to B (or from A to B') and from D to C. For typical memory devices, the propagation delay may be set to 12 ns from A to B (or B') and to 12 ns from D to C (for a total propagation delay from A to C of 24 ns, as before). The clock cycle is therefore set at 12 ns.

Figure 4:
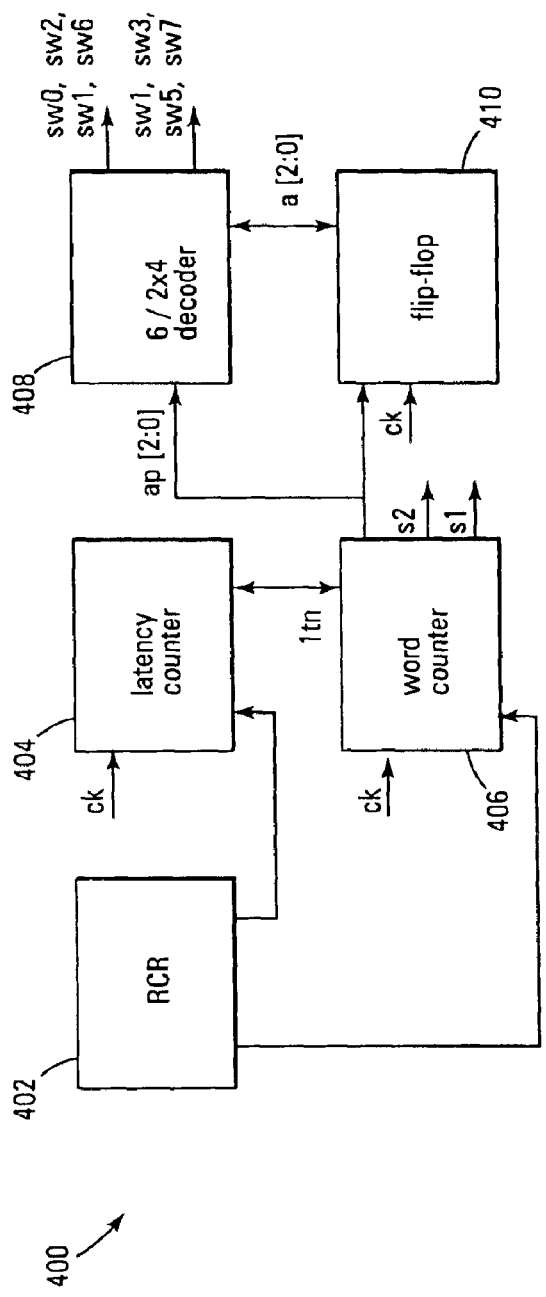
FIG. 4 shows one example of a burst state machine for a memory according to the present invention.

To perform the double word selection for the double bus architecture, the burst state machine must be modified accordingly. A simplified block diagram of a burst state machine 400 for use in connection with a double bus burst mode architecture is shown in FIG. 4. Burst state machine 400 includes RCR 402, latency counter 404, word counter 406, 6/2×4 decoder 408 and flip-flop 410. The word counter must select the new word address one clock in advance and, for this reason, the latency counter 404 must be modified to generate ltn signal one clock in advance, thereby providing through word counter 406 the anticipated inputs (ap[2:0]) to 6/2×4 decoder 408. The output of word counter 406 is delayed by one clock cycle by flip-flop 410 so that inputs a[2:0] are applied to the decoder 408 one clock cycle later. Decoder 408 provides two signals at a time: an output for sw0, sw2, sw4 or sw8, and an output for sw1, sw3, sw5 or sw7. To keep the pure latency, a double latency code (e.g., 8) must be written into RCR 202 so that in our example, the ltn signal from latency counter 404 will be raised high at the start of $(8-1)^{th}=7^{th}$ clock cycle. A data word is present on the output pad 314 (DQ[15:0]) two clock cycles later, i.e. at the start of the $9^{th}$ clock cycle, that is 8×12=96 ns from the rising edge of clock cycle 1. The latency expressed in terms of ns is the same as in the example of FIG. 2a.

Figure 4A:
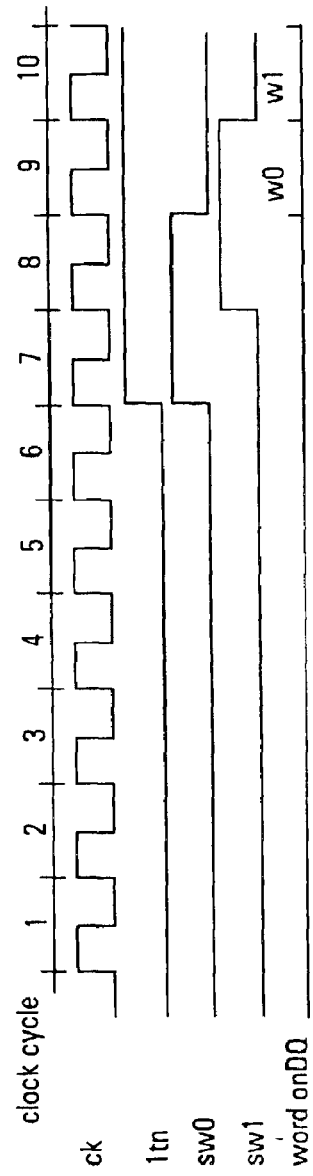
FIG. 4a shows a simplified timing diagram of the operation of the burst state machine shown in FIG. 4.
Figure 4B:
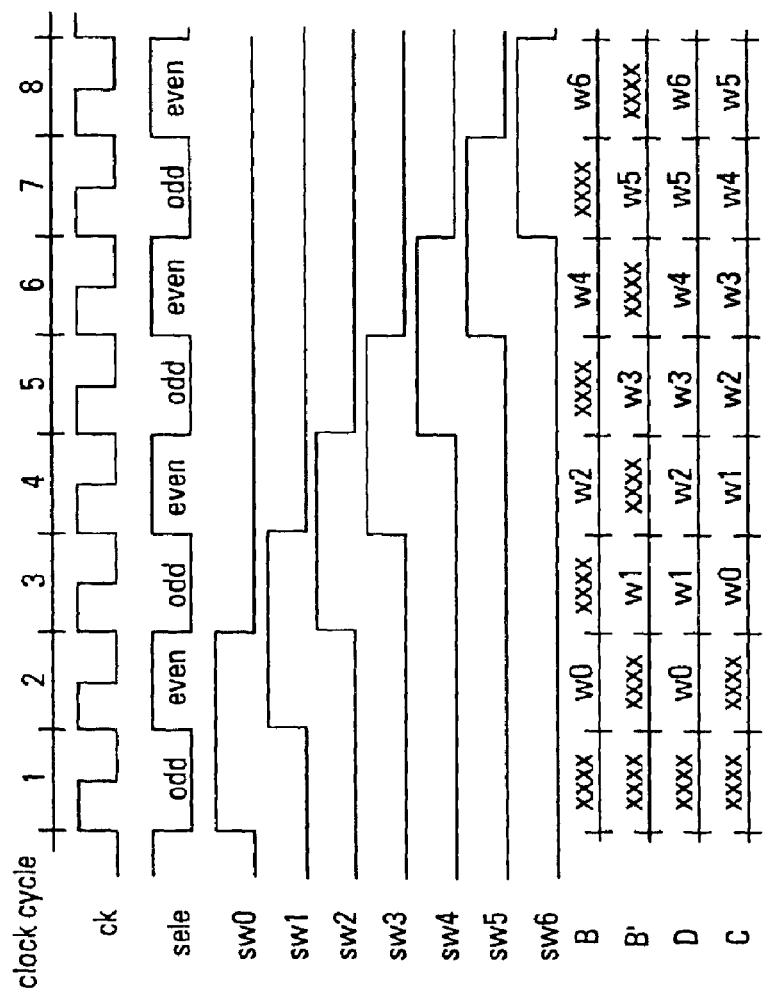
FIG. 4b shows a more detailed timing diagram of the operation of the burst state machine shown in FIG. 4.

FIG. 4a shows a simplified timing diagram of the operation of burst state machine 400. Again, 8 data words are used in this example, however a different number of data words or data bits per word could be used depending on design considerations. As can be seen in FIG. 4b, signals sw0, sw1 . . . sw6 overlap for one clock cycle for correct operation. In clock cycle 1, w0 is selected by sw0 and it is routed to B. The signal is assumed stable at node B only after the 12 ns propagation delay. In clock step 2, w1 is selected by sw1 and routed to B' in 12 ns. Now, w0 is stable at B. Since sele is high, w0 is transferred to the D bus in a negligible time. The propagation delay to move w0 to output pads 314 is thus only 12 ns.

In clock step 3, w0 is stable on the output pads 314 at node C. Word w1 is now stable at B'. Signal sele low routes the word w1 from B' to D. Word w2 is selected by sw2. It also propagates in 12 ns from A to B.

In clock step 4, w1 is stable on the output D and w2 is stable at B. Signal sele is high again and transfers w2 to D. Signals sw3 is activated and transfers w3 from A to B in 12 ns.

In clock step 5, w2 is stable on the output C. Signal sele low routes the next word w3 from B' to D. Word w4 is selected by sw4 and propagates in 12 ns from A to B.

Operation continues in this manner until the burst operation is completed. With the double bus architecture, throughput is effectively doubled without changing the overall propagation delay from A to C. In the example of FIG. 4a a clock with a period of 12 ns has been used based on an overall propagation delay of 24 ns from A to C. Of course, while 24 ns is typical of one technology, different technologies will have different propagation delays and improvements are continually being achieved. If faster or slower memory devices are used, the propagation delay may be adjusted accordingly.

Figure 5:
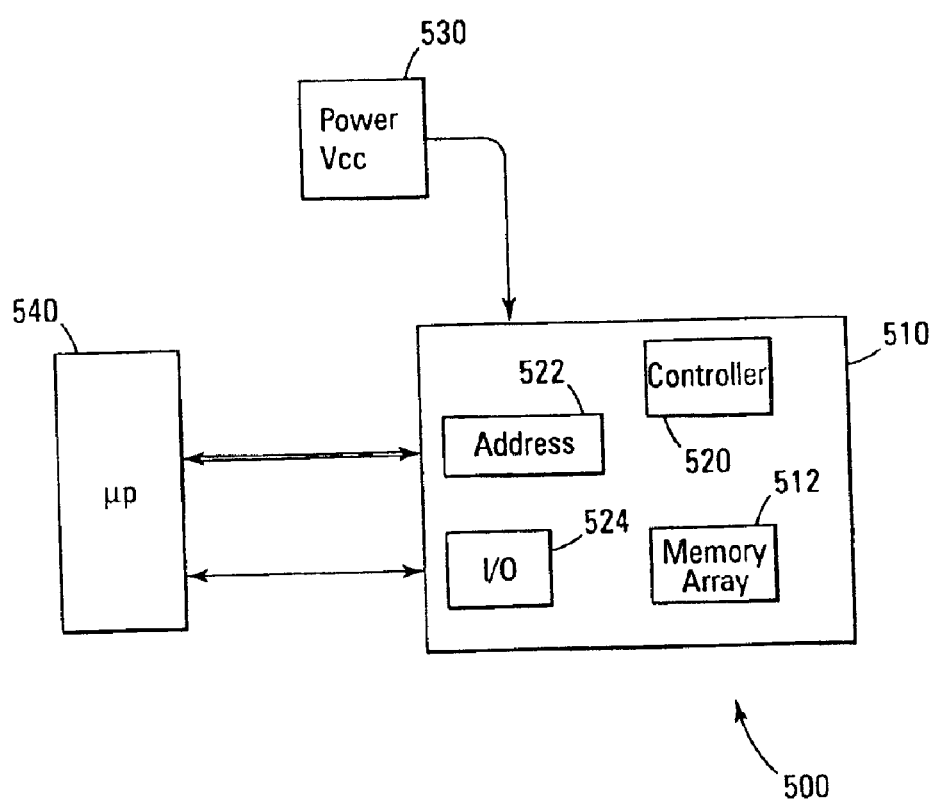
FIG. 5 shows a block diagram of a memory circuit coupled to a system including a processor.

FIG. 5 shows a computer system 500 including a memory circuit 510, a power supply 530 and a processor 540. Memory 510 includes a memory array 512 of nonvolatile memory cells (which can be flash memory cells), and a controller 520 that controls detailed operations of memory 510 such as the various individual steps necessary for carrying out writing, reading, and erasing operations and may also include the burst memory operations of the present invention. Memory 510 also includes an address decoder circuit 522 for decoding and selecting addresses provided by processor 540 to access appropriate memory cells in memory array 512, and an I/O circuit 524 for providing bi-directional communications between processor 540 and memory circuit 510.

Architectures according to the present invention may also be used in connection with different burst configurations. For example, word counter 406 and 6/2×4 decoder 408 can be configured to send a different sequence of signals sw0 . . . sw7, for example: sw5-sw4-sw7-sw6-sw1-sw0-sw3-sw2. The only limitation is that an even word must be followed by an odd word, and an odd word must be followed by an even word. All sequences of sw0 . . . sw7 signals otherwise are allowed.

CONCLUSION

The present invention includes a method and apparatus for a memory device having a burst architecture with a doubled clock rate. The throughput may be doubled by employing a double bus architecture that is multiplexed onto an output bus. The invention can be implemented with a minimum increment in silicon area and without greatly increasing the complexity of the logic controlling the core memory operation. Moreover, the throughput is doubled without increasing the memory device latency, i.e., the time needed to retrieve data from the memory from the time of the first request for the data.

What is claimed is:

1. A burst memory architecture comprising:
a memory array;
a plurality of sense amplifiers to read data from the memory array;
a plurality of first and second storage circuits to receive the data from the plurality of sense amplifiers;
a first plurality of drivers to receive the data from the plurality of first and second storage circuits and a second plurality of drivers to receive the data from the plurality of first and second storage circuits;
a first bus to receive the data from the first plurality of drivers;
a second bus to receive the data from the second plurality of drivers;
a switch to multiplex the data from the first and second busses onto an output bus; and
a controller to provide control signals to the memory wherein the data is loaded alternately on the first and second busses.

2. A method of burst access to a memory comprising:
fetching a first set of data from the memory in a first time period;
loading the first set of data on to a first memory bus;
fetching a second set of data from the memory in a second time period;
loading the second set of data on to a second memory bus; and
sequentially switching the data from the first and second memory busses on to an output bus.

3. The method of claim 2 wherein sequentially switching the data from the first and second memory busses on to the output bus comprises alternately switching the data from the first and second memory busses on to the output bus.

4. The method of claim 3 wherein alternately switching the data from the first and second memory busses on to the output bus comprises selecting even numbered words from the first set of data and odd numbered words from the second set of data.

5. The method of claim 2 wherein the latency of the memory device is preserved.

6. The method of claim 2 wherein the first and second time periods overlap.

7. A method of performing a burst memory operation, comprising:
reading data from a memory array;
storing the data in a plurality of first and second storage circuits;
receiving the data from the plurality of first storage circuits at a first plurality of drivers during a first time period and receiving the data from the plurality of second storage circuits at a second plurality of drivers during a second time period;
loading the data from the first plurality of drivers on to a first bus;
loading the data from the second plurality of drivers on to a second bus; and
multiplexing the data from the first and second busses onto an output bus.

8. A memory device comprising:
a memory array;
a bank of n×m sense amplifiers coupled to the memory array to read data from the memory array;
a plurality of first and second storage circuits coupled to the outputs of the sense amplifiers;
a first plurality of driver circuits coupled to the outputs of the first and second storage circuits;
a second plurality of driver circuits coupled to the outputs of the first and second storage circuits;
a first bus coupled to the outputs of the first plurality of driver circuits to receive even data words;
a second bus coupled to the outputs of the second plurality of driver circuits to receive odd data words;
a selection circuit comprising a plurality of first inputs coupled to the first bus, a plurality of second inputs coupled to the second bus and a plurality of outputs selectively coupled to the plurality of first and second inputs;
an output bus coupled to a plurality of the outputs of the selection circuit; and
a controller to provide control signals to the memory wherein even and odd data words are loaded respectively on the first and second busses and alternately switched by the selection circuit to the output bus.

9. A system comprising:
a central processor;
a memory device; and
a bus intercoupling the central processor and the memory device;
wherein the memory device further comprises:
a memory array;
a plurality of sense amplifiers to read data from the memory array;
a plurality of first and second storage circuits to receive data from the plurality of sense amplifiers;
a first plurality of drivers to receive data from the plurality of first and second storage circuits and a second plurality of drivers to receive data from the plurality of first and second storage circuits;
a first bus to receive data from the first plurality of drivers;
a second bus to receive data from the second plurality of drivers;

a switch to multiplex the data from the first and second busses onto an output bus; and a controller to provide control signals to the memory wherein data is loaded alternately on the first and second busses.

10. A burst memory architecture, comprising:

a memory array;

a plurality of sense amplifiers to read data from the array;

a first plurality of storage circuits coupled to the plurality of sense amplifiers for storing even data words;

a second plurality of storage circuits coupled to the plurality of sense amplifiers to store odd data words;

a first bus to receive even data words from the first plurality of storage circuits;

a second bus to receive odd data words from the second plurality of storage circuits; and a selection circuit to multiplex the even and odd data words onto an output bus.

11. A burst memory architecture comprising:

a plurality of sense amplifiers for fetching a block of data words;

a first memory bus to collect even data words of the block of data words during a burst mode memory operation; and a second memory bus to collect odd data words of the block of data words during the burst mode memory operation.

12. The burst memory architecture of claim 11 further comprising a selection circuit to multiplex the data words from the first and second memory busses to an output bus.

13. A burst state machine for use in connection with a double bus burst mode architecture, comprising:

a read configuration register to set a count mode of operation:

a latency counter to provide a signal indicative of the latency of the memory;

a word counter responsive to the read configuration register and to provide output signals to enable selection of data words;

a decoder to provide two selection signals at a time for loading the data onto first and second memory data busses in response to a count from the word counter; and a circuit to delay the output of the word counter by one clock cycle before it is applied to the decoder.

* * * * *

UNITED STATES PATENT AND TRADEMARK OFFICE
CERTIFICATE OF CORRECTION

PATENT NO. : 6,917,545 B2
DATED : July 12, 2005
INVENTOR(S) : Girolamo Gallo et al.

It is certified that error appears in the above-identified patent and that said Letters Patent is hereby corrected as shown below:

Title page,
Item [30], Foreign Application Priority Data, "RM2002A0369" should read
-- RM2002A000369 --.

Signed and Sealed this

Seventh Day of February, 2006

JON W. DUDAS
*Director of the United States Patent and Trademark Office*